(12) United States Patent
Ding et al.

(10) Patent No.: US 9,728,603 B2
(45) Date of Patent: Aug. 8, 2017

(54) BIPOLAR JUNCTION TRANSISTORS WITH DOUBLE-TAPERED EMITTER FINGERS

(71) Applicant: GLOBALFOUNDRIES INC., Grand Cayman (KY)

(72) Inventors: Hanyi Ding, Colchester, VT (US); Vibhor Jain, Essex Junction, VT (US); Alvin J. Joseph, Williston, VT (US); Anthony K. Stamper, Williston, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 10 days.

(21) Appl. No.: 14/745,764

(22) Filed: Jun. 22, 2015

(65) Prior Publication Data

US 2016/0372548 A1 Dec. 22, 2016

(51) Int. Cl.

| *H01L 29/00* | (2006.01) |
|---|---|
| *H01L 29/08* | (2006.01) |
| *H01L 29/73* | (2006.01) |
| *H01L 29/66* | (2006.01) |
| H01L 29/737 | (2006.01) |
| H01L 29/06 | (2006.01) |

(52) U.S. Cl.
CPC .... *H01L 29/0813* (2013.01); *H01L 29/66234* (2013.01); *H01L 29/66242* (2013.01); *H01L 29/73* (2013.01); *H01L 29/0649* (2013.01); *H01L 29/7378* (2013.01)

(58) Field of Classification Search
CPC ............... H01L 21/822; H01L 29/0804; H01L 29/0808; H01L 29/0813; H01L 29/41708; H01L 29/66287; H01L 29/66303; H01L 29/7322; H01L 29/7325; H01L 29/7375
See application file for complete search history.

(56) References Cited

U.S. PATENT DOCUMENTS

| 4,506,280 | A | | 3/1985 | Merrill |
|---|---|---|---|---|
| 4,769,688 | A | | 9/1988 | Cotton |
| 5,321,279 | A | | 6/1994 | Khatibzadeh et al. |
| 5,387,807 | A | | 2/1995 | Bayraktaroglu |
| 5,387,813 | A | * | 2/1995 | Iranmanesh ........ H01L 29/0692 257/554 |

(Continued)

FOREIGN PATENT DOCUMENTS

| TW | 221520 B | 3/1994 |
|---|---|---|
| TW | 239896 B | 2/1995 |
| TW | 200529428 A | 9/2005 |

OTHER PUBLICATIONS

Taiwan Intellectual Property Office, Examination Report issued in Taiwanese Patent Application No. 105117541 dated Jan. 25, 2017.

*Primary Examiner* — Mark Tornow
*Assistant Examiner* — Priya Rampersaud
(74) *Attorney, Agent, or Firm* — Thompson Hine LLP; Anthony Canale

(57) ABSTRACT

Device structures for a bipolar junction transistor and methods of fabricating a device structure for a bipolar junction transistor. A base layer comprised of a first semiconductor material is formed. An emitter layer comprised of a second semiconductor material is formed on the base layer. The emitter layer is patterned to form an emitter finger having a length and a width that changes along the length of the emitter finger.

18 Claims, 6 Drawing Sheets

(56) References Cited

U.S. PATENT DOCUMENTS

| | | | |
|---|---|---|---|
| 5,446,294 A | | 8/1995 | Bayraktaroglu |
| 5,528,058 A | | 6/1996 | Pike, Jr. et al. |
| 5,616,950 A | | 4/1997 | Liu |
| 5,850,099 A | * | 12/1998 | Liu .................... H01L 23/4824 257/280 |
| 5,962,913 A | * | 10/1999 | Honda ................ H01L 21/8249 257/579 |
| 5,986,324 A | * | 11/1999 | Adlerstein .......... H01L 29/7371 257/522 |
| 6,064,109 A | | 5/2000 | Blanchard et al. |
| 7,705,425 B2 | | 4/2010 | Ma et al. |
| 8,159,048 B2 | | 4/2012 | Apel et al. |
| 8,203,185 B2 | | 6/2012 | Sriram |
| 2004/0012036 A1 | * | 1/2004 | Kotani ................ H01L 29/0821 257/197 |
| 2005/0127399 A1 | | 6/2005 | Meadows |
| 2012/0068309 A1 | * | 3/2012 | Diefenbeck ....... H01L 21/26513 257/565 |
| 2012/0168907 A1 | * | 7/2012 | Malladi ............... H01L 29/0821 257/565 |

\* cited by examiner

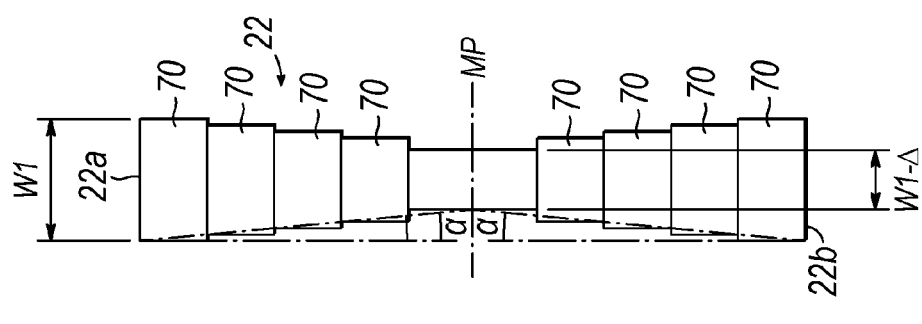
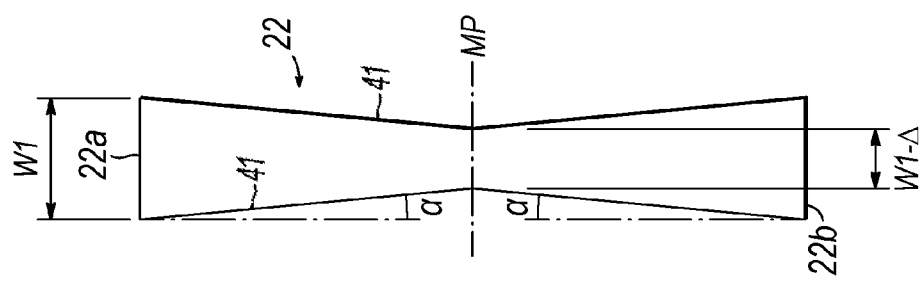

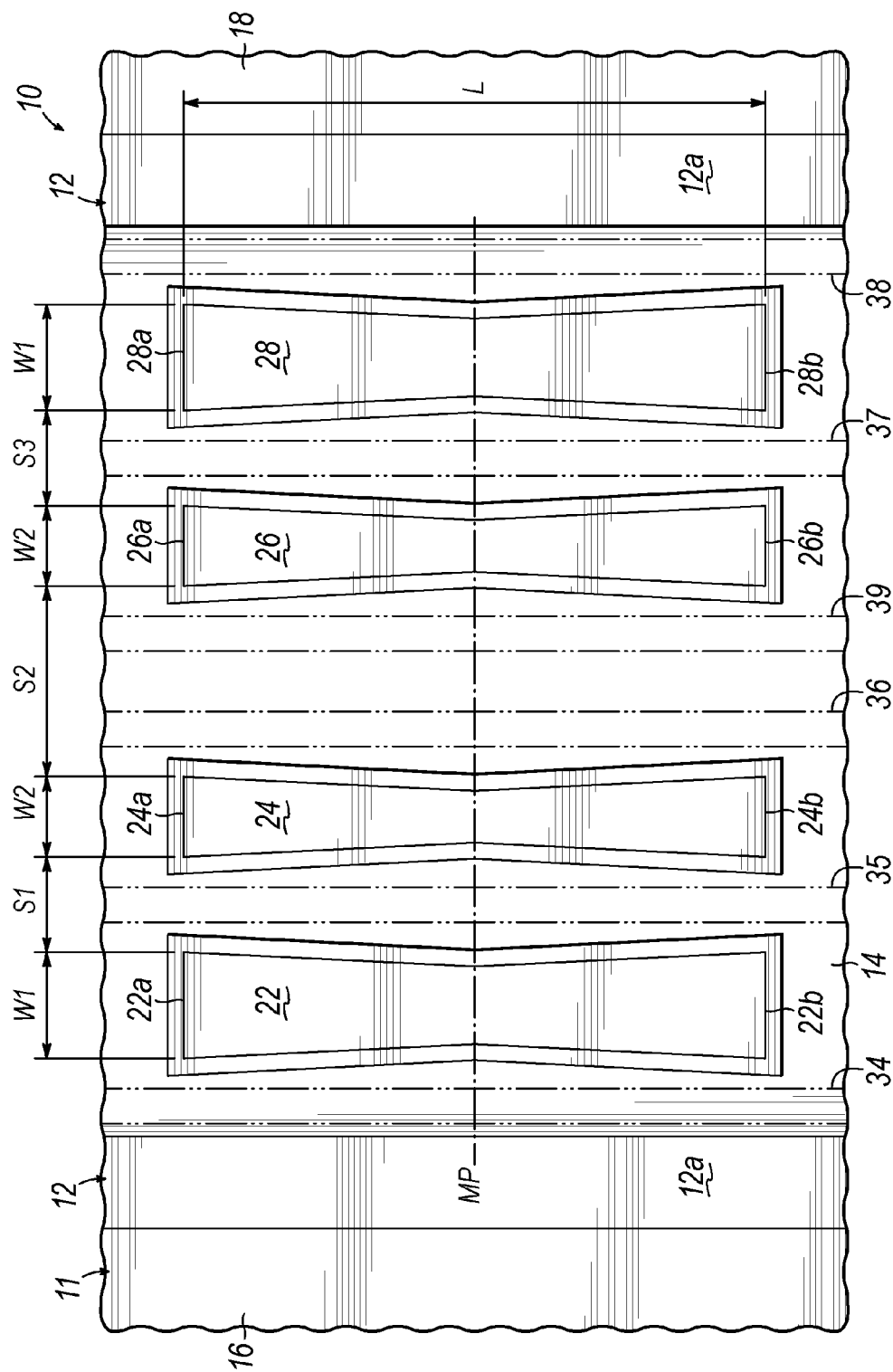

BIPOLAR JUNCTION TRANSISTORS WITH DOUBLE-TAPERED EMITTER FINGERS

BACKGROUND

The invention relates generally to semiconductor devices and integrated circuit fabrication and, in particular, to fabrication methods and device structures for a bipolar junction transistor.

Bipolar junction transistors may be found, among other end uses, in high-frequency and high-power applications. In particular, bipolar junction transistors may find specific end uses in amplifiers for wireless communications systems and mobile devices, switches, and oscillators. Bipolar junction transistors may also be used in high-speed logic circuits. Bipolar junction transistors are three-terminal electronic devices that include an emitter, an intrinsic base, and a collector defined by regions of different semiconductor materials. In the device structure, the intrinsic base is situated between the emitter and collector. An NPN bipolar junction transistor may include n-type semiconductor material regions constituting the emitter and collector, and a region of p-type semiconductor material constituting the intrinsic base. A PNP bipolar junction transistor includes p-type semiconductor material regions constituting the emitter and collector, and a region of n-type semiconductor material constituting the intrinsic base. In operation, the base-emitter junction is forward biased, the base-collector junction is reverse biased, and the collector-emitter current may be controlled by the base-emitter voltage.

Bipolar junction transistors are composed of one or more emitter fingers and they may have a non-uniform temperature profile along their finger length with a cooler temperature profile at the ends of the fingers. This non-uniform temperature may change transistor parameters, such as current gain (beta), resulting in non-uniform beta along the length of the finger. Thus, it is desirable to make the temperature profile along and among the emitter fingers more uniform.

Consequently, improved fabrication methods and device structures are needed for a bipolar junction transistor.

SUMMARY

In an embodiment of the invention, a method is provided for fabricating a device structure for a bipolar junction transistor. A base layer comprised of a first semiconductor material is formed. An emitter layer comprised of a second semiconductor material is formed on the base layer. The emitter layer is patterned to form an emitter finger having a length and a width that changes along the length of the emitter finger.

In an embodiment of the invention, a device structure is provided for a bipolar junction transistor. The device structure includes a base layer comprised of a first semiconductor material and an emitter finger comprised of a second semiconductor material on the base layer. The emitter finger has a length and a width that changes along the length of the emitter finger.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 1A is an enlarged view of the one of the emitter fingers shown in FIG. 1.

FIGS. 2-4 are top views similar to FIG. 1 of a substrate portion processed by processing methods for fabricating a device structure in accordance with alternative embodiments of the invention.

FIG. 5 is a top view similar to FIG. 1A of an emitter finger in accordance with an alternative embodiment of the invention.

DETAILED DESCRIPTION

Figure 1:
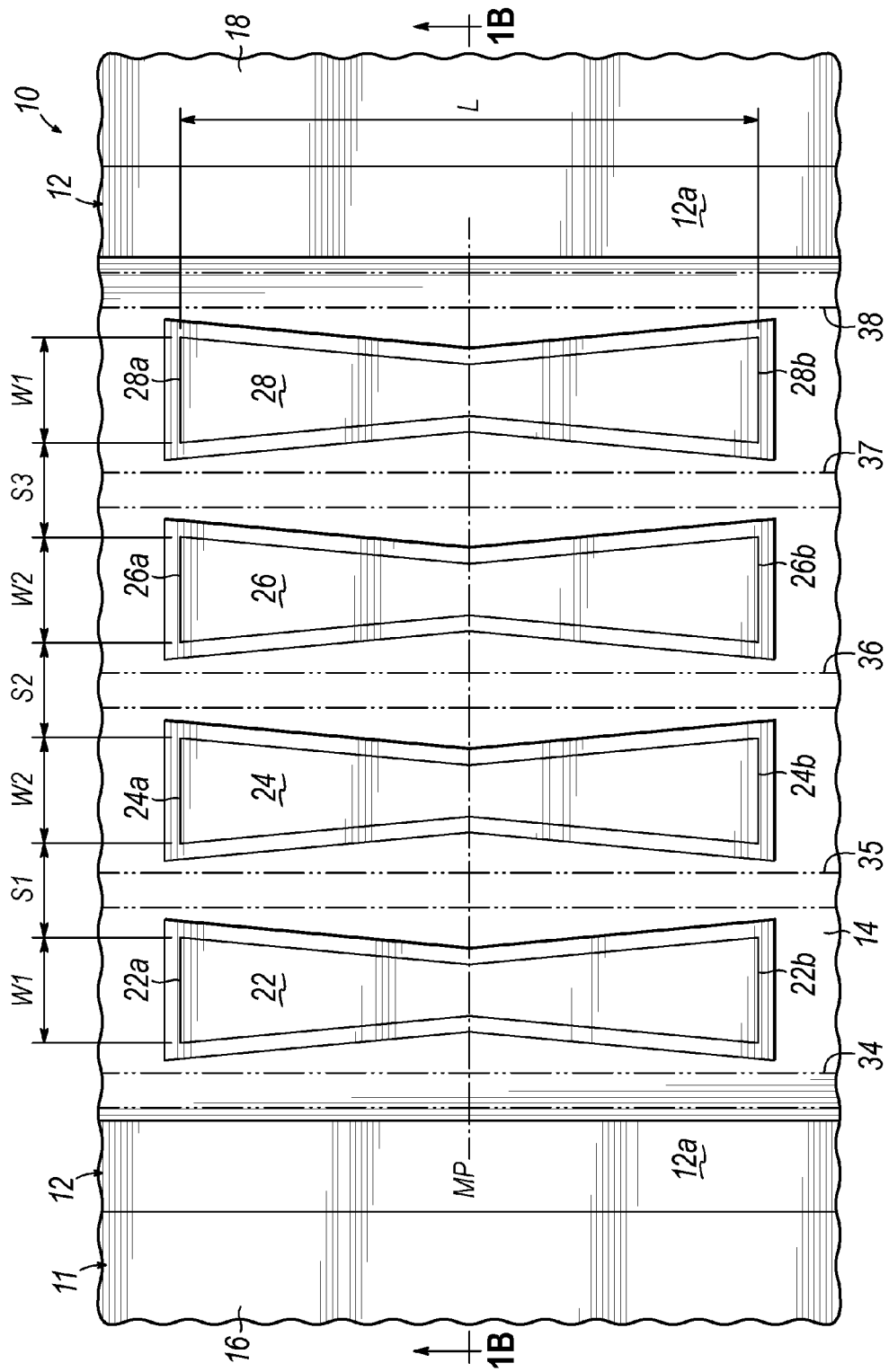
FIG. 1 is a top view of a portion of a substrate processed by a processing method for fabricating a device structure in accordance with an embodiment of the invention.
Figure 1B:
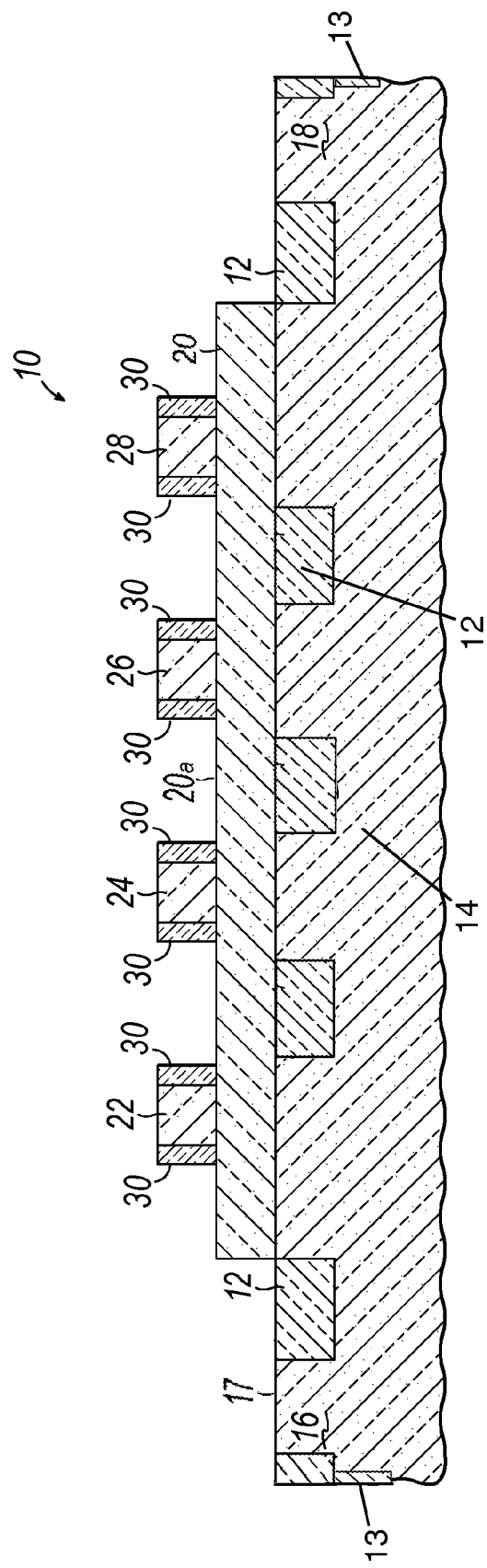
FIG. 1B is a cross-sectional view taken generally along line 1B-1B in FIG. 1.

With reference to FIGS. 1, 1A, 1B and in accordance with an embodiment of the invention, a device structure 10 is formed using a substrate 11 comprises a single-crystal semiconductor material usable to form the devices of an integrated circuit. For simplicity, the device structure 10 does not show some details associated with a typical SiGe HBT or other NPN transistor types. The semiconductor material constituting the substrate 11 may include an epitaxial layer at its top surface 17, which may contain an amount of an electrically-active dopant that enhances its electrical properties relative to the remainder of the substrate 11. For example, the substrate 11 may include an epitaxial layer of single crystal silicon that is doped with a concentration of, in a construction for an NPN transistor, an n-type dopant from Group V of the Periodic Table (e.g., phosphorus (P), arsenic (As), or antimony (Sb)) in a concentration effective to impart n-type conductivity.

Shallow trench isolation regions 12 are located in the semiconductor material of the substrate 11. The shallow trench isolation regions 12 define the bounds of, and furnish electrical isolation for, each emitter finger relative to the adjacent ones through the collector 14. In certain embodiments, the trench isolation regions 12 may be omitted from internal emitter finger regions to improve thermal dissipation.

Deep trench isolation regions 13 are located in the semiconductor material of the substrate 11. The deep trench isolation regions 13 define the bounds of, and furnish electrical isolation for, the collector 14 and collector contact regions 16, 18, which are each comprised of the semiconductor material of the substrate 11 to the adjacent devices. The collector contact regions 16, 18 are positioned adjacent to the collector 14, and are laterally separated from the collector 14 by the shallow trench isolation regions 12. The collector contact regions 16, 18 are coupled with the collector 14 by portions of the semiconductor material of the substrate 11 positioned beneath the shallow trench isolation regions 12. Typically, the deep trench isolation regions 13 are 3 um to 6 um deep relative to the top surface 17 of the substrate 11 and are filled with one or more dielectric materials. In certain embodiments, the deep trench isolation regions 13 may be omitted from the collector boundary regions and replaced with shallow trench isolation regions 12 for better thermal dissipation.

The shallow trench isolation regions 12 may be formed by depositing a hardmask, patterning the hardmask and substrate 11 with lithography and etching processes to define trenches, depositing an electrical insulator to fill the trenches, planarizing the electrical insulator relative to the hardmask using a chemical mechanical polishing (CMP) process, and removing the hardmask. In one embodiment, the shallow trench isolation regions 12 may be comprised of silicon dioxide ($SiO_2$) deposited by chemical vapor phase deposition (CVD).

The deep trench isolation regions 13 may be formed by depositing a hardmask, patterning with lithography and etching processes to define trenches through the shallow trench region 12 and substrate 11, depositing an electrical insulator to fill the trenches, planarizing using a chemical mechanical polishing (CMP) process, and removing the hardmask. In one embodiment, the deep trench isolation regions 13 may be comprised of silicon dioxide ($SiO_2$) deposited by chemical vapor phase deposition (CVD).

A base layer 20 is located on the top surface 17 of the substrate 11. The base layer 20 may be comprised of a semiconductor material, such as silicon-germanium (SiGe) in an alloy with a content of silicon (Si) ranging from 95 atomic percent to 50 atomic percent and a content of germanium (Ge) ranging from 5 atomic percent to 50 atomic percent. The germanium content of the base layer 20 may be uniform across the thickness of base layer 20, or graded and/or stepped across the thickness of base layer 20. If the germanium content is stepped, respective thicknesses of the base layer 20 that are directly adjacent to the substrate 11 and directly adjacent to the subsequently-formed emitter fingers may lack a germanium content and may therefore constitute intrinsic layers comprised entirely of silicon. The base layer 20 may comprise a dopant, such as a p-type dopant selected from Group III of the Periodic Table (e.g., boron) in a concentration that is effective to impart p-type conductivity to the constituent semiconductor material and, optionally, carbon (C) to suppress the mobility of the p-type dopant.

The base layer 20 may be formed using a low temperature epitaxial (LTE) growth process, such as vapor phase epitaxy (VPE) conducted at a growth temperature ranging from 400° C. to 850° C. Single crystal semiconductor material (e.g., single crystal silicon and/or single crystal SiGe) is epitaxially grown or deposited by the low temperature epitaxial growth process on the top surface 17 of substrate 11. The base layer 20 may have an epitaxial relationship with the single crystal semiconductor material of the substrate 11 in which the crystal structure and orientation of the substrate 11 operates as a template to establish the crystal structure and orientation of the base layer 20 during growth.

An emitter of the device structure 10 is collectively comprised of a plurality of emitter fingers 22, 24, 26, 28 that are located on the top surface of the base layer 20. The emitter fingers 22, 24, 26, 28 are arranged lengthwise parallel to each other with emitter fingers 24, 26 centrally located between emitter fingers 22 and emitter finger 28 at the periphery of a cell. The cell including the emitter fingers 22, 24, 26, 28 may include a different number of emitter fingers than the number in the representative embodiment for the device structure 10.

The emitter fingers 22, 24, 26, 28 may be comprised of a semiconductor material that differs in composition from the semiconductor material of the base layer 20 and that has an opposite conductivity type from the semiconductor material of the base layer 20. For example, the composition of the material comprising the emitter fingers 22, 24, 26, 28 may be comprised of silicon and lack germanium that is present in at least a portion of the base layer 20, and may contain an n-type dopant in a concentration effective to impart n-type conductivity. In a representative embodiment, the semiconductor material comprising the emitter fingers 22, 24, 26, 28 may be n-type polysilicon (i.e., n-type polycrystalline silicon) deposited by chemical vapor deposition.

To form the emitter fingers 22, 24, 26, 28, a mask layer may be applied on a top surface of a deposited layer (e.g., n-type polysilicon) and patterned with photolithography. Specifically, a mask layer is applied that covers the deposited layer at the intended location of the emitter fingers 22, 24, 26, 28 to be subsequently formed. To that end, the mask layer may comprise a light-sensitive material, such as a photoresist, that is applied as a coating by a spin coating process, pre-baked, exposed to light projected through a photomask, baked after exposure, and developed with a chemical developer to pattern an etch mask. The shape of the strips is selected to match and produce the desired double-tapered shape for the emitter fingers 22, 24, 26, 28. An etching process is used, with the mask layer present on the top surface of the deposited layer, to form the emitter fingers 22, 24, 26, 28 from the deposited layer at the locations of the stripes in the pattern. The etching process may be conducted in a single etching step or multiple steps, and may rely on one or more etch chemistries. The mask layer may be removed after the emitter fingers 22, 24, 26, 28 are formed by the etching process. If comprised of a photoresist, the mask layer may be removed by ashing or solvent stripping, followed by a conventional cleaning process.

The portions of the base layer 20 covered by the emitter fingers 22, 24, 26, 28 may define an intrinsic base that forms a junction with the emitter, and that forms another junction with the collector 14. Portions of the base layer 20 that are not covered by the emitter fingers 22, 24, 26, 28 may be doped (e.g., by ion implantation) to define an extrinsic base with enhanced electrical conductivity in comparison with the intrinsic base. Spacers 30 may be formed on the vertical sidewalls of the emitter fingers 22, 24, 26, 28 by etching one or more dielectric layers (e.g., silicon dioxide or silicon nitride ($Si_3N_4$)) with an anisotropic etching process.

The resulting device structure 10 is a bipolar junction transistor that includes the emitter fingers 22, 24, 26, 28, the collector 14, and the portion of the base layer 20 (i.e., intrinsic base) that is vertically between the emitter fingers 22, 24, 26, 28 and the collector 14. The device structure 10 may be characterized as a heterojunction bipolar transistor (HBT) if two or all three of the semiconductor materials comprising the emitter fingers 22, 24, 26, 28, the collector 14, and the base layer 20 have different compositions. During the front-end-of-line (FEOL) portion of the fabrication process, the device structure 10 is replicated across at least a portion of the surface area of the substrate 11. In BiCMOS integrated circuits, complementary metal-oxide-semiconductor (CMOS) transistors may be formed using other regions of the substrate 11, and may be protected while bipolar junction transistors are formed. As a result, bipolar junction transistors (or HBTs) and CMOS transistors may be available and co-located on the same substrate 11.

Standard middle-of-line (MOL) processing and back-end-of-line (BEOL) processing follows, which includes formation of dielectric layers, via plugs, and wiring for an interconnect structure coupled with the device structure 10, as well as other similar contacts for additional device structures 10 and CMOS transistors that may be included in other circuitry fabricated on the substrate 11. The MOL processing, which includes formation of one or more dielectrics layer, rows of contacts 34-38 coupled with the base layer 20, and contacts coupled with the collector contact regions 16, 18, follows to define a local interconnect structure. Wiring formed by MOL and BEOL processing may couple the emitter fingers 22, 24, 26, 28 in parallel with other circuitry on the chip or off the chip.

The row of contacts 34 is located between collector contact region 16 and emitter finger 22, and the row of contacts 38 is located between collector contact region 18 and emitter finger 28. The row of contacts 35 is located between emitter finger 22 and emitter finger 24, the row of contacts 36 is located between emitter finger 24 and emitter finger 26, and the row of contacts 37 is located between emitter finger 26 and emitter finger 28.

The emitter fingers 22, 24, 26, 28 have geometrical shapes parameterized to improve the uniformity of the temperature distribution across the emitter. In particular, the emitter fingers 22, 24, 26, 28 are each tapered along their respective lengths L such that the widths (i.e., the distances between the opposite sidewalls in a direction transverse to the lengths L) of the emitter fingers 22, 24, 26, 28 vary with position along the length. The dimensions of the emitter fingers 22, 24, 26, 28 may be evaluated in a plane that is parallel to the top surface 17 of the substrate 11 and that is transverse to the layer thickness of the emitter fingers 22, 24, 26, 28.

As best shown in FIG. 1A, the representative emitter finger 22 includes end surfaces 22a, 22b at its opposite ends and side surfaces 41 that connect the end surfaces 22a, 22b. The end surface 22a is spaced along the length L from the end surface 22b. The emitter finger 22 may be symmetrical along its length L relative to the midplane MP. The width of the emitter finger 22 (i.e., the distance between the side surfaces 41 at any point along the length L) is greatest at its opposite end surfaces 22a, 22b (i.e., W1) and is smallest at the midplane MP (i.e., W1−Δ where Δ represents the width difference). The width of emitter finger 22 tapers (i.e., narrows) at an angle α from the width W1 at the end surface 22a of emitter finger 22 to the width W1−Δ at midplane MP of emitter finger 22. The width of emitter finger 22 also tapers at an angle α from the width W1 at the end surface 22b of emitter finger 22 to the width W1−Δ at the midplane MP of emitter finger 22. In an embodiment, the width of the emitter finger 22 decreases linearly from each of the opposite end surfaces 22a, 22b toward the midplane MP. As the emitter finger 22 tapers toward midplane MP, the distance separating the side surfaces 41 decreases and is at a minimum at the midplane MP. The angle α is related to the value of width difference Δ. As the width difference Δ increases, the degree of tapering and the angle α likewise increase as the dual tapered geometrical shape of the emitter fingers 22, 24, 26, 28 becomes more pronounced.

In an alternative embodiment, the width of the emitter finger 22 may decrease non-linearly from each of the opposite end surfaces 22a, 22b toward the midplane MP.

Emitter fingers 24, 26, 28 are constructed similar to the representative emitter finger 22 in that each includes end surfaces and side surfaces analogous to end surfaces 22a, b and side surfaces 41. In an embodiment, emitter finger 28 may have the same construction as emitter finger 22. In an embodiment, emitter fingers 24, 26 may likewise be similar in construction to emitter finger 22 other than the widths W2 may differ from the widths W1 of emitter fingers 22, 28. In addition, the angle α may be different for emitter fingers 24, 26 in comparison with emitter fingers 22, 28.

In the representative embodiment, the emitter fingers 22, 24, 26, 28 may have the same dimensions in that the individual widths W1 of emitter fingers 22, 28 are equal to the individual widths W2 of emitter fingers 24, 26. In an embodiment, the width of the emitter fingers 22, 24, 26, 28 at each opposite end is twice the width at midplane MP. The individual widths W1 vary along the lengths, L, such that each of the emitter fingers 22, 28 is wider by a factor of two at the respective opposite end surfaces 22a, b, 28a, b than at the midplane MP. The individual widths W2 vary along the lengths, L, such that each of the emitter fingers 24, 26 is wider by a factor of two at the respective opposite end surfaces 24a, b, 26a, b than at the midplane MP.

The value for the width difference Δ may range from 0.1 μm to 1.0 μm. As a specific numerical example, each of the emitter fingers 22, 24, 26, 28 may have a width of 1.6 μm at their respective opposite ends and a width of 0.8 μm at the midplane MP so that the average width is 1.2 μm. If the emitter fingers 22, 24, 26, 28 have the same dimensions and the values for the widths W1 and W2 are equal, the values for Δ and a will also be equal. The width difference Δ for the preceding numerical example is equal to 0.8 μm. Alternatively, even if the widths W1 and W2 are not equal, the values for Δ and α may be equal.

Emitter finger 22 is separated from emitter finger 24 by a spacing, S1, emitter finger 24 is separated from emitter finger 26 by a spacing, S2, and emitter finger 26 is separated from emitter finger 28 by a spacing, S3. In the representative embodiment, the spacings S1, S2, and S3 are evaluated at the opposite ends of the emitter fingers 22, 24, 26, 28. Alternatively, the spacings S1, S2, and S3 may be evaluated at another location (e.g., at the midplane MP) between opposite ends of the emitter fingers 22, 24, 26, 28. In the representative embodiment, the emitter fingers 22, 24, 26, 28 have the same spacing in that individual spacings S1, S2, and S3 are equal to provide a uniform pitch.

During operation, the emitter fingers 22, 24, 26, 28 experience a temperature rise arising from power dissipation and Joule heating. The double-tapered emitter fingers 22, 24, 26, 28 may exhibit improved temperature uniformity along their lengths L relative to each other such that the variation in the temperature profiles among the emitter fingers 22, 24, 26, 28 is reduced in comparison with non-tapered emitter fingers of uniform width and spacing. In addition, double-tapered emitter fingers 22, 24, 26, 28 may exhibit reduced peak temperatures in comparison with non-tapered emitter fingers of uniform width and spacing that may exhibit a non-uniform temperature profile along their finger length with a cooler temperature profile at the ends of the fingers. As a result, the temperature profiles for the emitter fingers 22, 24, 26, 28 may exhibit a higher level of similarity than in the absence of the double-tapered shape and a reduced non-uniformity in their current gain or beta along their length.

The improved temperature uniformity and reduced peak temperatures of the double-tapered emitter fingers 22, 24, 26, 28 may reduce the probability of thermal runaway arising from a temperature increase that prompts a current increase, which may lead to a further increase in temperature (i.e., an uncontrolled positive feedback). Reducing the susceptibility to thermal runaway and the peak temperature may improve the lifetime and robustness of a cell of a power amplifier in which the emitter fingers 22, 24, 26, 28 are coupled in parallel. This may enhance thermal stability and power handling capability over the lifetime of the power amplifier. The parameterization of the double-tapering of the emitter fingers 22, 24, 26, 28 may be selected such that the total footprint projected as a layout area onto the surface of the base layer 20 matches the layout area of non-tapered emitter fingers of uniform width in the context of a design modification to an existing device structure. In addition, ballasting resistors may not be required to promote temperature uniformity among the different emitter fingers 22, 24, 26, 28, although they can be used to further improve the thermal behavior of the device.

With reference to FIG. 2 in which like reference numerals refer to like features in FIGS. 1, 1A, 1B, the tapering and the spacing of the emitter fingers 22, 24, 26, 28 in the cell may be adjusted to change the temperature profiles. In particular, the emitter fingers 22, 28 at the periphery of the cell may be configured with the one set of dimensions to provide the double tapering for emitter fingers 22, 28, and emitter fingers 24, 26 may be configured with a different set of dimensions to provide the double tapering for emitter fingers 24, 26. Emitter fingers 24, 26 are centrally located in the cell between emitter finger 22 and emitter finger 28. In the representative embodiment, the width W1 of emitter fingers 22, 28 that are at the periphery of the cell is greater than the width W2 of emitter fingers 24, 26. The individual widths W1 and W2 still vary along the lengths, L, such that each of the emitter fingers 22, 24, 26, 28 is wider by a factor of two at the respective opposite end surfaces 22$a$, $b$, 24$a$, $b$, 26$a$, $b$, 28$a$, $b$ than at the midplane. However, the width W2 may be a fixed value less than (i.e., narrower than) the width W1 at any given location along the common lengths. As a numerical example, the widths W1 at end surfaces 22$a$, $b$, 28$a$, $b$ may be 1.6 µm and the widths W2 at end surfaces 24$a$, $b$, 26$a$, $b$ may be 1.2 µm to provide a 0.4 µm width difference, and the widths W1 at midplane of emitter fingers 22, 28 may be 1.2 µm and the widths W2 of emitter fingers 24, 26 may be 0.8 µm to also provide a 0.4 µm width difference. At any given location along the lengths L between the opposite ends, the width difference (i.e., Δ) is constant (i.e., 0.4 µm) to provide the fixed value.

The spacings S1, S2, and S3 of the emitter fingers 22, 24, 26, 28 may also be adjusted to provide a non-uniform spacing or pitch. Specifically, the spacing S2 between emitter fingers 24, 26 may be greater than the spacing S1 between emitter fingers 22, 24 and greater than the spacing S3 between emitter fingers 26, 28, and the spacings S1 and S3 may be equal. In other words, the emitter fingers 24, 26 that are centrally located in the cell may have a greater spacing S2 than the spacings S1, S3 between emitter fingers 22, 24 and emitter fingers 26, 28 at the periphery of the cell. In an embodiment, the spacing S2 may be equal to twice the spacing S1 and equal to twice the spacing S3. The increase in the spacing S2 may promote the addition of an additional row of contacts 39 between emitter fingers 24, 26 such that multiple rows of contacts 36, 39 contact the base layer 20 between emitter fingers 24, 26.

The smaller width of the emitter fingers 24, 26 in comparison with emitter fingers 22, 28 and/or the wider spacing of the emitter fingers 24, 26 in comparison with emitter fingers 22, 24 and emitter fingers 26, 28 may further improve the temperature uniformity along their lengths L relative to each other such that the variation in the temperature profiles among the emitter fingers 22, 24, 26, 28 is reduced in comparison with non-tapered emitter fingers of uniform width and spacing.

Figure 3:
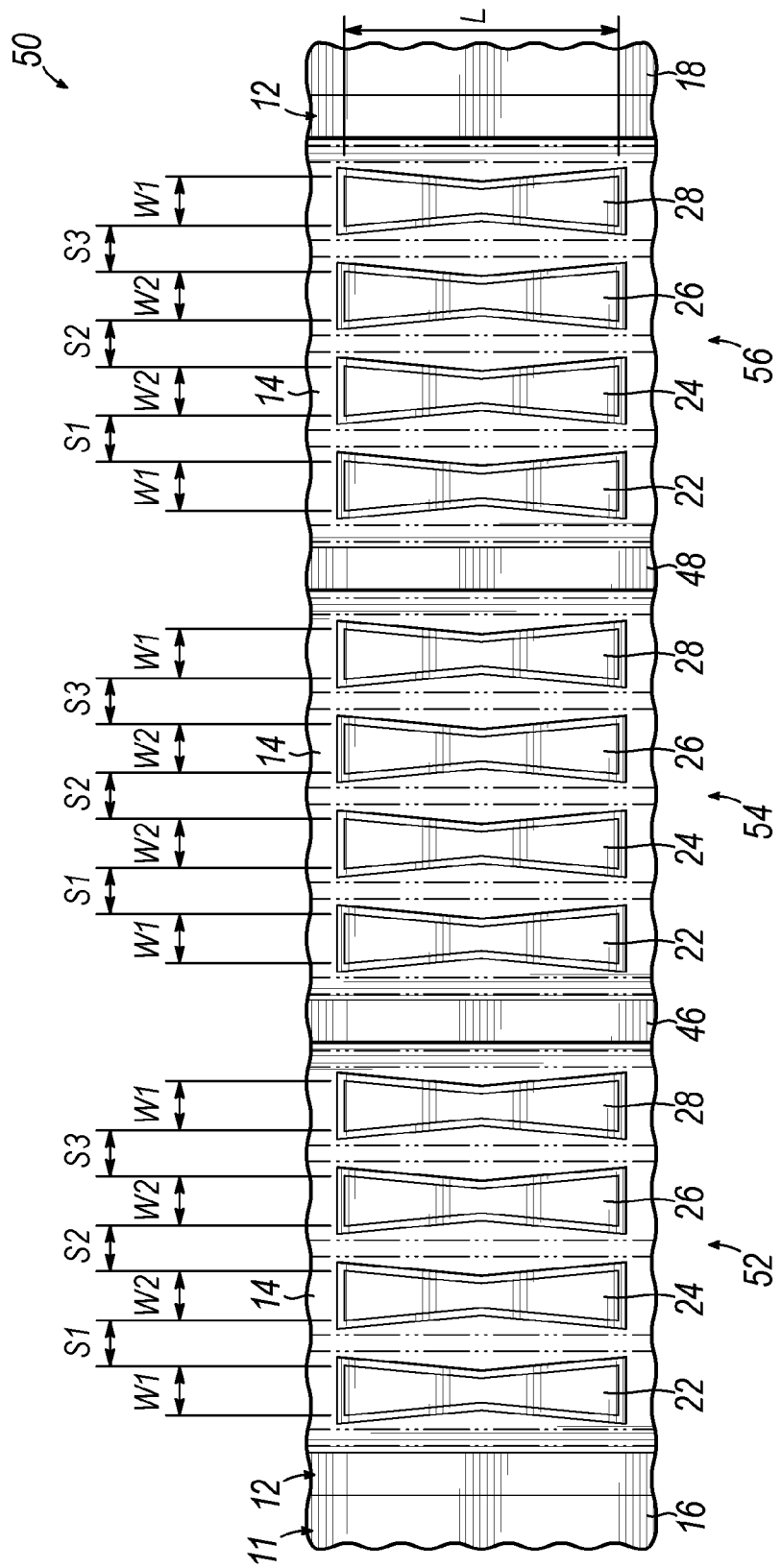

With reference to FIG. 3 in which like reference numerals refer to like features in FIGS. 1, 1A, 1B, a device structure 50 may be comprised of a plurality of unit cells 52, 54, 56 in which one or more of the individual unit cells 52, 54, 56 is constructed with the device structure 10 of FIGS. 1, 1A, 1B and includes a plurality of emitter fingers with the double-tapered widths and spacing characterizing the emitter fingers 22, 24, 26, 28. In the representative embodiment, all of the individual unit cells 52, 54, 56 are constructed with the device structure of FIGS. 1, 1A, 1B. Additional collector contacts 46, 48 are respectively located between unit cells 52 and 54 and between unit cells 54 and 56. The emitter fingers in all of the unit cells 52, 54, 56 are coupled in parallel in the device structure 50. In an embodiment, the device structure 50 may be utilized in the construction of a power amplifier.

Figure 4:
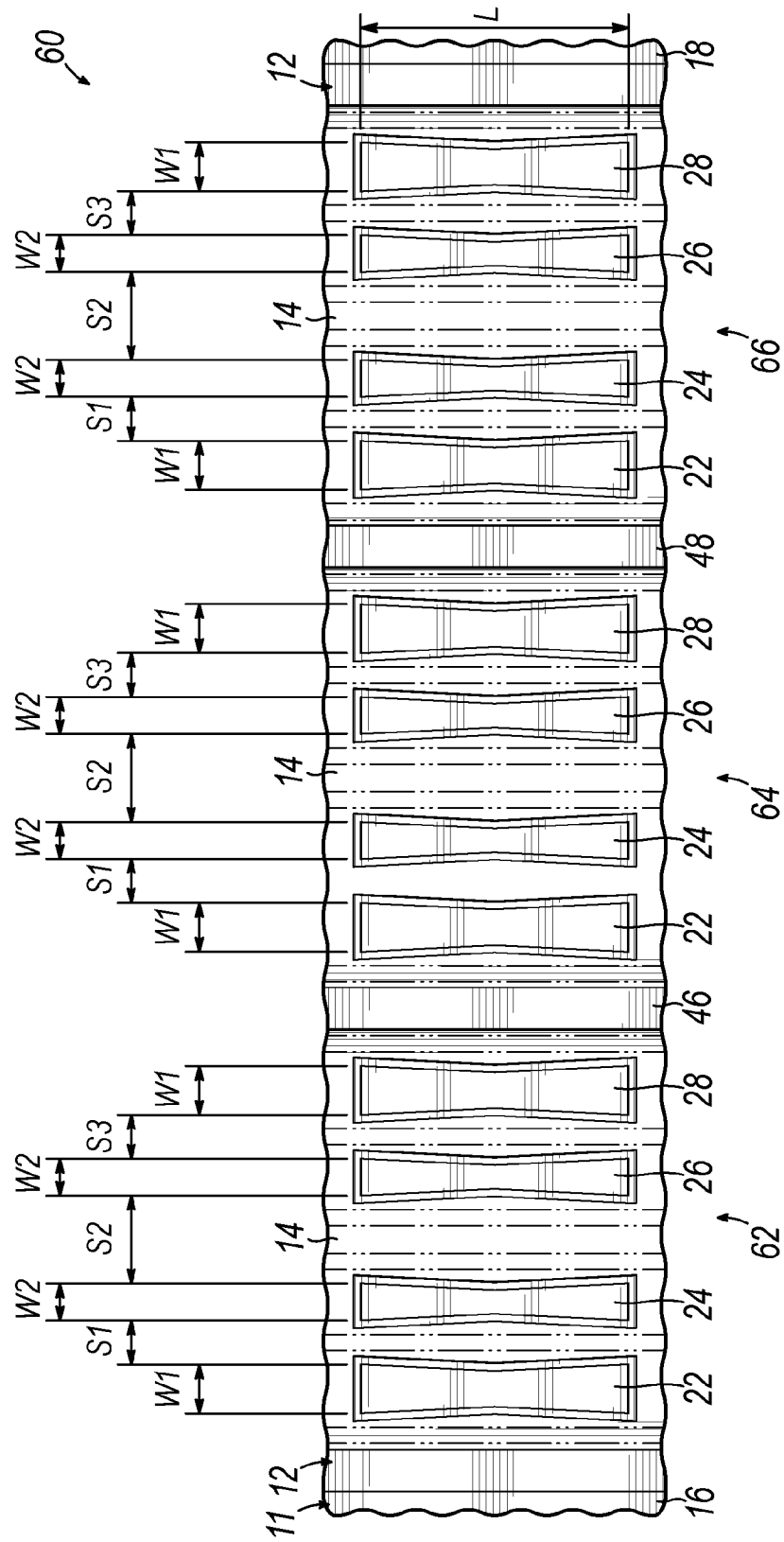

With reference to FIG. 4 in which like reference numerals refer to like features in FIG. 2, a device structure 60 may be comprised of a plurality of unit cells 62, 64, 66 in which one or more of the individual unit cells 62, 64, 66 is constructed with the device structure 10 of FIG. 2 and includes a plurality of emitter fingers with the double-tapered widths and spacing characterizing the emitter fingers 22, 24, 26, 28. In the representative embodiment, all of the individual unit cells 62, 64, 66 are constructed with the device structure of FIGS. 2, 2A, 2B. The emitter fingers in all of the unit cells 62, 64, 66 are coupled in parallel in the device structure 60. In an embodiment, the device structure 60 may be utilized in the construction of a power amplifier.

In some specific embodiments, the unit cells 52, 54, 56 of the power cell array in FIG. 3 and the unit cells 62, 64, 66 of the power cell array in FIG. 4 may be identical in terms of spacings and widths for the emitter fingers 22, 24, 26, 28 in each unit cell. However, the unit cells may be stitched together for optimized temperature profile as the widths and spacings within each particular unit cell may differ from the widths and spacings in the other unit cells. Furthermore, the intra-cell spacings between adjacent pairs of unit cells 52, 54, 56 or between adjacent pairs of unit cells 62, 64, 66 may differ. As a specific example, the central unit cell (e.g., unit cell 54 or unit cell 64) may have larger spacings relative to the emitter fingers in the peripheral unit cells (e.g., unit cells 52, 56 or unit cells 62, 66).

In certain embodiments, some or all of the emitter fingers 22, 24, 26, 28 in one or more of the unit cells 52, 54, 56 or some or all of the emitter fingers 22, 24, 26, 28 in one or more of the unit cells 62, 64, 66 may be rectangular and not double-tapered.

With reference to FIG. 5 in which like reference numerals refer to like features in FIG. 1A, the emitter fingers 22, 24, 26, 28 may be constructed from a plurality of blocks or steps 70 of semiconductor material. In the representative emitter finger 22, the steps 70 progressively change in dimensions (i.e., become smaller in size) along the length L from each of the opposite end surfaces 22$a$, 22$b$ toward the midplane MP. The side surfaces 41 of the emitter finger 22 are stepwise continuous and no longer does the width W1 decrease in a continuous manner from the end surfaces 22$a$, 22$b$ to the midplane MP. The side surfaces 41 of the emitter finger 22 include a plurality of discrete vertical planar surfaces that incrementally decrease in size and, in particular, incrementally decrease in width to provide the double tapering characterized by the width difference Δ and the angle α. Emitter fingers 24, 26, 28 may have the same type of construction as emitter finger 22 consistent with the description of the emitter fingers 22, 24, 26, 28 in connection with FIGS. 1-4.

The emitter fingers 22, 24, 26, 28 in the alternative embodiment are formed using a mask layer that is applied on a top surface of a deposited layer (e.g., n-type polysilicon) and patterned with photolithography. The use of steps 70 during patterning may be employed, for example, in integrated circuit processes that do not allow either non-orthogonal or diagonal lines. The number of discrete steps 70 contained in the progression from largest size to smallest size may vary contingent upon factors such as the design rules for the emitter definition layer and the taper and width dimension in the design specification for the device structure 10.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a device structure for a bipolar junction transistor, the method comprising:
    forming a base layer comprised of a first semiconductor material;
    forming an emitter layer comprised of a second semiconductor material on the base layer; and
    patterning the emitter layer to form a first emitter finger located on the base layer,
    wherein the first emitter finger has a length, a first end surface, a second end surface spaced along the length from the first end surface, a first side surface that extends from the first end surface to the second end surface, a second side surface that extends from the first end surface to the second end surface, and a width between the first side surface and the second side surface, the width linearly decreases with increasing distance from the first end surface such that the first emitter finger tapers at a first angle along a first portion of the length of the first emitter finger, and the width linearly decreases with increasing distance from the second end surface such that the first emitter finger tapers at a second angle along a second portion of the length of the first emitter finger.

2. The method of claim 1 wherein the first portion of the length of the first emitter finger and the second portion of the length of the first emitter finger meet at a midplane of the first emitter finger, the first emitter finger tapers at the first angle from the first end surface toward the midplane of the first emitter finger, and the first emitter finger tapers at the second angle from the second end surface toward the midplane of the first emitter finger.

3. The method of claim 1 wherein the emitter layer is patterned to form a second emitter finger having a length and a width that changes along the length of the second emitter finger.

4. The method of claim 3 wherein the second emitter finger has an end surface, and the width at the end surface of the second emitter finger is different from the width at the first end surface of the first emitter finger.

5. The method of claim 3 wherein the emitter layer is patterned to form a third emitter finger having a length and a width that changes along the length of the third emitter finger, the first emitter finger is separated by a first spacing from the second emitter finger, the second emitter finger is separated by a second spacing from the third emitter finger, and the first spacing is not equal to the second spacing.

6. The method of claim 5 wherein the second emitter finger is located laterally between the first emitter finger and the third emitter finger.

7. The method of claim 1 wherein the first angle is equal to the second angle.

8. The method of claim 3 wherein the base layer is located on a substrate, the device structure includes a collector contact region in the substrate, and the first emitter finger is located laterally between the second emitter finger and the collector contact region.

9. A device structure for a bipolar junction transistor, the device structure comprising:
    a base layer comprised of a first semiconductor material; and
    a first emitter finger comprised of a second semiconductor material and located on the base layer, the first emitter finger having a length, a first end surface, a second end surface spaced along the length from the first end surface, a first side surface that extends from the first end surface to the second end surface, a second side surface that extends from the first end surface to the second end surface, and a width between the first side surface and the second side surface,
    wherein the width linearly decreases with increasing distance from the first end surface such that the first emitter finger tapers at a first angle along a first portion of the length of the first emitter finger, and the width linearly decreases with increasing distance from the second end surface such that the first emitter finger tapers at a second angle along a second portion of the length of the first emitter finger.

10. The device structure of claim 9 wherein the first portion of the length of the first emitter finger and the second portion of the length of the first emitter finger meet at a midplane of the first emitter finger, the first emitter finger tapers at the first angle from the first end surface toward the midplane of the first emitter finger, and the first emitter finger tapers at the second angle from the second end surface toward the midplane of the first emitter finger.

11. The device structure of claim 9 further comprising:
    a second emitter finger comprised of the second semiconductor material, the second emitter finger having a length and a width that changes along the length of the second emitter finger.

12. The device structure of claim 11 wherein the second emitter finger has an end surface, and the width at the end surface of the second emitter finger is different from the width at the first end surface of the first emitter finger.

13. The device structure of claim 12 further comprising:
a third emitter finger comprised of the second semiconductor material, the third emitter finger having a length and a width that changes along the length of the third emitter finger, the first emitter finger separated by a first spacing from the second emitter finger, the second emitter finger separated by a second spacing from the third emitter finger, and the first spacing not equal to the second spacing.

14. The device structure of claim 13 wherein the second emitter finger is located laterally between the first emitter finger and the third emitter finger.

15. The device structure of claim 11 wherein the base layer is located on a substrate, and further comprising:
a collector contact region in the substrate,
wherein the first emitter finger is located laterally between the second emitter finger and the collector contact region.

16. The device structure of claim 9 wherein the first angle is equal to the second angle.

17. The device structure of claim 9 wherein the first portion of the length of the first emitter finger and the second portion of the length of the first emitter finger meet at a midplane of the first emitter finger, the first emitter finger tapers at the first angle from the first end surface of the first emitter finger toward the midplane of the first emitter finger, and the width at the first end surface of the first emitter finger differs from the width at the midplane of the first emitter finger by 0.1 µm to 1.0 µm.

18. The device structure of claim 17 wherein the width at the second end surface of the first emitter finger differs from the width at the midplane of the first emitter finger by 0.1 µm to 1.0 µm.

* * * * *